US006910637B2

(12) United States Patent
Hsieh et al.

(10) Patent No.: US 6,910,637 B2
(45) Date of Patent: Jun. 28, 2005

(54) STACKED SMALL MEMORY CARD

(75) Inventors: Jackson Hsieh, Hsinchu Hsien (TW); Jichen Wu, Hsinchu Hsien (TW); Abnet Chen, Hsinchu Hsien (TW)

(73) Assignee: Kingpak Technologies Inc., Hsinchu Hsien (TW)

(*) Notice: Subject to any disclaimer, the term of this patent is extended or adjusted under 35 U.S.C. 154(b) by 0 days.

(21) Appl. No.: 10/683,838

(22) Filed: Oct. 9, 2003

(65) Prior Publication Data

US 2005/0077362 A1 Apr. 14, 2005

(51) Int. Cl.[7] .................................................. G06K 19/06

(52) U.S. Cl. ....................... 235/492; 235/487; 438/365; 438/455; 438/597; 438/598; 257/678; 361/737; 361/735

(58) Field of Search ................................. 235/492, 487; 438/365, 378, 455, 597, 598; 257/678; 361/737, 735

(56) References Cited

U.S. PATENT DOCUMENTS

| | | | | |
|---|---|---|---|---|
| 2003/0157748 A1 * | 8/2003 | Kim et al. | .................. | 438/107 |
| 2004/0142540 A1 * | 7/2004 | Kellar et al. | ................ | 438/455 |
| 2004/0152276 A1 * | 8/2004 | Nishimura | .................. | 438/365 |
| 2004/0159709 A1 * | 8/2004 | Ohta et al. | .................. | 235/492 |
| 2004/0169285 A1 * | 9/2004 | Verma et al. | .............. | 257/777 |

* cited by examiner

*Primary Examiner*—Jared J. Fureman
*Assistant Examiner*—Allyson N Trail
(74) *Attorney, Agent, or Firm*—Pro-Techtor International Services

(57) ABSTRACT

A stacked small memory card includes an upper memory card and a lower memory card, the upper memory card and the lower memory card respectively formed a first heat sink and a second heat sink, the first heat sink and the second heat sink are stacked together, so that, the heat of the upper memory card and the lower memory card may be dispersed via the first heat sink and the second heat sink. Thus, the stacked small memory card of present invention having high function of disperses heat to promote its durability and lifetime effectively.

7 Claims, 1 Drawing Sheet

STACKED SMALL MEMORY CARD

BACKGROUND OF THE INVENTION

1. Field of the Invention

The present invention relates to a stacked small memory card, and in particular to a stacked small memory card that has a long lifetime and high durability.

2. Description of the Related Art

The prior method for producing a general memory card always packs chips to single integrated circuit, then mounts the IC onto a printed circuit board by the way of surface mount technique (SMT). The chip may be a memory element, such as flash memory. The golden fingers mounted on the printed circuit board for inserting into a slot of a computer main-board. In addition to some passive elements such as resistance, capacitor and inductor are mounted on the memory card.

Referring to FIG. 1 showing a side schematic illustrate of a prior memory card, the golden finger 15 is used to insert into a slot of a computer main-board, there are active elements and passive elements on the module card, the active elements usually are packed to an integrated circuit 11. Each integrated circuit 11 encapsulates a chip 12, the chip 12 may be a memory chip, for example a flash memory chip. The pins 13 of integrated circuit 11 are mounted on the printed circuit board 14 of the memory card by SMT, the printed circuit board 14 has a solder point 17 connected to pin 13. The prior arts has the following disadvantages:

A chip 12 must be packed then mounted on the circuit board 14, so more steps is unnecessary leads to the cost in manufacturing and packing will be increased.

A memory card always includes many ICs so that the integrated circuit 11 must be mounted on the PCB 14 one by one during manufacturing the module card.

The cost of SMT is expensive. Special manufacture devices such as a SMT machine and a solder furnace will extra the cost of equipment.

The memory card is manufactured separately so that the throughput is low.

As a result of integrated circuit 11 cannot be dispersed heat effectively, therefore the quality and durability of the small memory card is not excellent.

SUMMARY OF THE INVENTION

The object of the present invention is to provide a stacked small memory card may be manufactured convenient, the manufacturing processes may be simplified and the manufacturing cost may decreased.

Another object of the present invention is to provide a stacked small memory card having high function of disperse heat to promote its durability and lifetime effectively.

To achieve the above-mentioned object, the present invention includes an upper memory card, and a lower memory card. The upper memory card includes a first substrate, at least one memory chip, a first heat sink, and a first glue layer. The first substrate has an upper surface and a lower surface, the upper surface is formed with a plurality of the connected points and a plurality of golden fingers are electrically connected the plurality of connected points, and a plurality of through holes, which filled with metal, penetrate the upper surface to the lower surface, the memory chip, that is mounted on the first substrate, electrically connected to the connected points of the first substrate, the first heat sink, which is mounted on the lower surface of the first substrate, contact with the metal, which is filled within the through holes, the first glue layer is coated the memory chip, the upper memory card is arranged in the electric device, so that the golden finger of the first substrate may be electrically connected to the electric device. The lower memory card includes a second substrate, at least one memory chips, a second heat sink, and a second glue layer. The second substrate has an upper surface and a lower surface, the lower surface is formed with a plurality of connected points and a plurality of golden fingers electrically connected the plurality of connected points and a plurality of through holes, which filled with metal, penetrate upper surface to lower surface, the memory chip, that is mounted on the lower surface of the second substrate, electrically connect the connected points of the second substrate, the second heat sink, which is mounted on the upper surface of the second substrate, contacted with the metal, which is filled within the through holes, the second glue layer is coated on the memory chip, the upper memory card is used to set in an electric device to make the golden finger of the second substrate electrically connect to the electric device, the first heat sink of the upper memory card is mounted on the second heat sink of the lower memory card.

According to one aspect of the present invention, the heat from the memory chip of the upper memory chip and the bottom memory chip may be traveled to the heat sink via the metal, which are filled within the plurality of through holes. Therefore, promoting the durability and dependability of the small memory card.

DETAILED DESCRIPTION OF THE INVENTION

Figure 1:
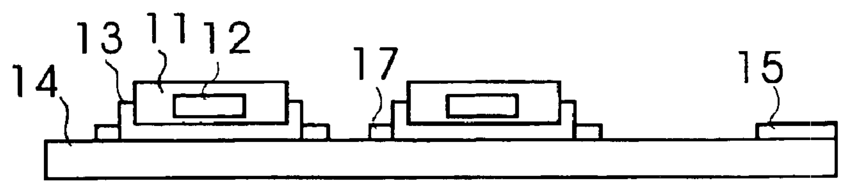
FIG. 1 is a schematic illustrate showing a conventional small memory card structure.
Figure 2:
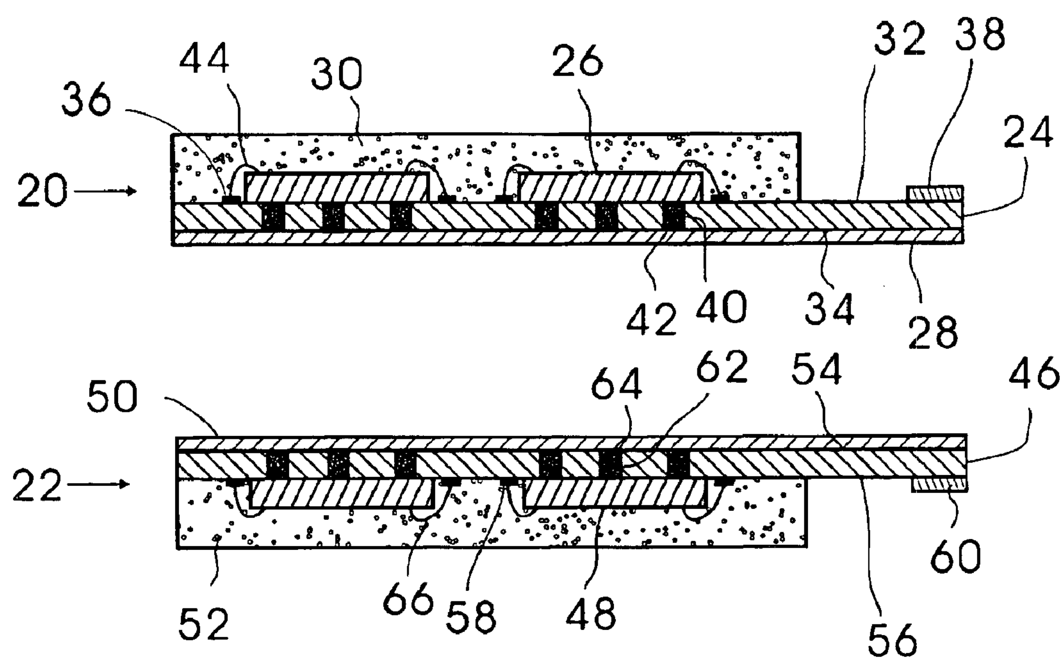
FIG. 2 is the first schematic illustrates showing a stacked small memory card structure of the present invention.
Figure 3:
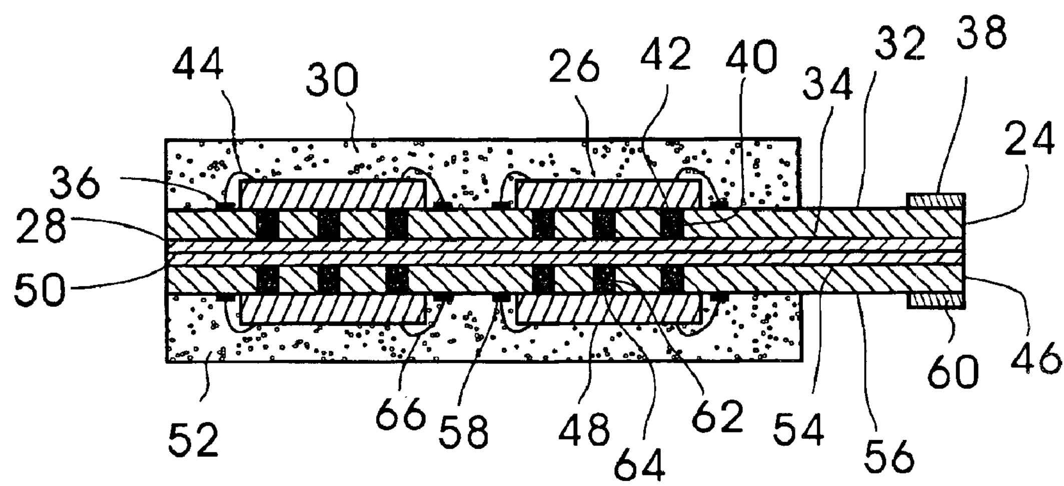
FIG. 3 is the second schematic illustrates showing a stacked small memory card structure of the present invention.

FIG. 2, and FIG. 3 are the schematic illustrates showing a stacked small memory card structure of the present invention, which include an upper memory card 20 and a lower memory card 22.

The upper memory card 20 includes a first substrate 24, at least one memory chip 26, a first heat sink 28, and a first glue layer 30, the first substrate 24 has an upper surface 32 and a lower surface 34, the upper surface 32 has a plurality of connected points 36, and a plurality of golden fingers 38 electrically connected with the plurality of connected points 36, and a plurality of through holes 40, which filled with metal 42, penetrate from the upper surface 32 to the lower surface 34, the metal 42 may be cooper, the memory chip 26 is mounted on the upper surface 32 of the first substrate 24, and a plurality of wires 44 are electrically connected to the connected points 36 of the first substrate 24, the first heat sink 28, which may be cooper or aluminum, is mounted on the lower surface 34 of the first substrate 24 and contacted with the metal 42, which filled within the through holes 40, the first glue layer 30 is coated the memory chip 26, the upper memory card 20 is used to arrange in an electric device, so that, the golden fingers 38 of the first substrate 24 may be electrically connected to the electric device.

The lower memory card 22 includes a second substrate 46, at least one memory chip 48, a second heat sink 50, and a second glue layer 52. The second substrate 46 has an upper surface 54 and a lower surface 56, the lower surface 56 formed with a plurality of connected points 58, and a plurality of golden fingers 60 connected electrically to connected points 58, and a plurality of through holes 62, which filled with cooper metal 64, penetrate from the upper surface 54 to the lower surface 56, the memory chip 48, which is mounted on the lower surface 56 of the second substrate 46, and the plurality of wires 66 electrically connected to the connected points of the second substrate, the second heat sink 50 is made of copper or aluminum, is mounted on the upper surface 54 of the second substrate and contacted with the metal 64, which filled within the through holes 62, the second glue layer 52 coated the memory chip 48, the lower memory card 22 is used to arrange in the electric device, so that, the golden fingers 60 of the second substrate 46 may be electrically connected to the electric device, the first heat sink 28 of the upper memory card 20 is packed on the second heat sink 50 of the lower memory card 22.

Therefore, the packed small memory card of the present invention has the following advantages:

Since the heat of the upper memory chip 26 of the upper memory card 20 may be traveled to the first heat sink 28 via the metal 42, which is filled within the through hole 40 of the first substrate 24, the heat can be rapidly spread out through first heat sink 28, and the heat of the memory chip 48 of the lower memory card 22 may be traveled to the second heat sink 50 via the metal 64 which is filled within the through hole 62 of the second substrate 46, the heat can be rapidly spread out through second heat sink 50, so that, proving the durability and dependability of the small memory card.

Since the upper memory chip 26 is arranged on the upper surface 32 of the first substrate 24, and the lower memory chip 48 is arranged on the lower surface 56 of the second substrate 46, then, the first glue layer 30 and the second glue layer 52 are packed every upper memory chips 26 and every lower memory chips 48. So as to the manufacturing processes can be simplified, and the manufacturing costs also can be lowered.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A stacked small memory card to be set in an electric device, comprising:

An upper memory card including a first substrate, at least one memory chip, a first heat sink, and a first glue layer, the first substrate formed with an upper surface and a lower surface, the upper surface formed with a plurality of connected points, a plurality of golden fingers electrically connected to the plurality of connected points and a plurality of through holes, which filled with metal, penetrate from the upper surface to the lower surface, at least one memory chip, each of which is mounted on the upper surface of the first substrate, electrically connected to the connected points of the first substrate, the first heat sink, which is mounted on the lower surface of the first substrate, contacted with the metal, which is filled within the through holes, the first glue layer coating the memory chip, the upper memory card is used to arranged in the electric device, so that, the golden fingers may be electrically connected to the electric device; and A lower memory card including a second substrate, at least one memory chip, a second heat sink, and a second glue layer, the second substrate formed with an upper surface and a lower surface, the lower surface formed with a plurality of connected points, a plurality of golden fingers electrically connected to the connected points and a plurality of through holes, which filled with metal, penetrate from the upper surface to the lower surface, the memory chip, which is mounted on the lower surface of the second substrate, electrically connected to the connected points of the second substrate, the second heat sink being mounted on the upper surface of the second substrate, contacted with the metal, which is filled within the through holes, the second glue layer coating the memory chip, which is used to arrange in the electric device, so that, the golden fingers of the second substrate may be electrically connected to the electric device, the first heat sink of the upper memory card being mounted on the second heat sink of the lower memory card.

2. The stacked small memory card according to claim 1, wherein the memory chip of the upper memory card electrically connects to the plurality of the connected points of the first substrate via a plurality of wires.

3. The stacked small memory card according to claim 1, wherein the metal, which is filled within the each of through holes of the first substrate, is copper.

4. The stacked small memory card according to claim 1, wherein the first heat sink is made of copper or aluminum.

5. The stacked small memory card according to claim 1, wherein the memory chip of the lower memory card electrically connects to the connected points of the second substrate via a plurality of wires.

6. The stacked small memory card according to claim 1, wherein the metal, which is filled within the though holes of the second substrate, is cooper.

7. The stacked small memory card according to claim 1, wherein the second heat sink may be cooper or aluminum.

* * * * *